(12) United States Patent
Pieler et al.

(10) Patent No.: US 11,742,745 B2
(45) Date of Patent: Aug. 29, 2023

(54) METHOD FOR IDENTIFYING THE FILTER INDUCTOR OF A GRID INVERTER

(71) Applicant: Fronius International GmbH, Pettenbach (AT)

(72) Inventors: Roland Pieler, Wels-Thalheim (AT); Michael Rothböck, Wels-Thalheim (AT); Stefan Wieser, Wels-Thalheim (AT); Harald Kreuzer, Wels-Thalheim (AT)

(73) Assignee: FRONIUS INTERNATIONAL GMBH, Pettenbach (AT)

( * ) Notice: Subject to any disclaimer, the term of this patent is extended or adjusted under 35 U.S.C. 154(b) by 0 days.

(21) Appl. No.: 17/783,854

(22) PCT Filed: Dec. 9, 2020

(86) PCT No.: PCT/EP2020/085268
§ 371 (c)(1),
(2) Date: Jun. 9, 2022

(87) PCT Pub. No.: WO2021/116166
PCT Pub. Date: Jun. 17, 2021

(65) Prior Publication Data
US 2023/0051498 A1 Feb. 16, 2023

(30) Foreign Application Priority Data
Dec. 10, 2019 (EP) .................... 19214654

(51) Int. Cl.
*H02M 7/5387* (2007.01)
*H02M 1/12* (2006.01)
*G01R 27/26* (2006.01)

(52) U.S. Cl.
CPC ......... *H02M 1/126* (2013.01); *G01R 27/2611* (2013.01); *H02M 7/53871* (2013.01)

(58) Field of Classification Search
CPC .. H02M 7/5387; H02M 7/53871; H02M 1/26; G01R 27/26; G01R 27/2611
See application file for complete search history.

(56) References Cited

U.S. PATENT DOCUMENTS 9,906,044 B2 2/2018 Dibben et al.
10,090,777 B2 10/2018 Dent
(Continued)

FOREIGN PATENT DOCUMENTS

EP 3 236 568 10/2017

OTHER PUBLICATIONS

Wu Fengjiang et al., "Improved Elimination Scheme of Current Zero-Crossing Distortion in Unipolar Hysteresis Current Controlled Grid-Connected Inverter", IEEE Transactions on Industrial Informatics, IEEE Service Center, New York, NY, US, vol. 11, No. 5, DOI: 10.1109/TTI.2015.2470540, ISSN: 1551-3203, XP011670969, Oct. 1, 2015, pp. 1111-1118.
(Continued)

*Primary Examiner* — Adolf D Berhane
(74) *Attorney, Agent, or Firm* — Greenblum & Bernstein, P.L.C.

(57) ABSTRACT

A method for operating an inverter includes applying, via a switching unit of the inverter, an AC voltage to a phase line in which a filter inductor is arranged, determining a coil current ($i_L$) of the filter inductor and determining a coil voltage ($u_L$) of the filter inductor, determining a first value ($L(I_x)$) of the filter inductor for a first value of the coil current ($I_x$), determining an inductance profile of the filter inductor with respect to the coil current, using the determined first value of the filter inductance and optionally using the at least one determined further value of the filter inductance, and controlling the switching unit of the inverter, via a control unit, to generate an alternating current in the phase (Continued)

line. At least one parameter of the control process is continuously adapted to the momentary coil current according to the determined current-dependent inductance profile.

15 Claims, 4 Drawing Sheets

(56) References Cited

U.S. PATENT DOCUMENTS

| | | | |
|---|---|---|---|
| 10,523,105 B2 | 12/2019 | Benesch et al. | |
| 2010/0097827 A1* | 4/2010 | Ben-Yaakov | H05B 41/2886 363/65 |
| 2015/0016162 A1 | 1/2015 | West | |
| 2023/0116269 A1* | 4/2023 | Wieser | H03H 7/0115 361/88 |

OTHER PUBLICATIONS

Int'l Search Report (Form PCT/ISA/210) conducted in Int'ls Appln. No. PCT/EP2020/085268 (dated Feb. 8, 2021).
Int'l Written Opinion (Form PCT/ISA/237) conducted in Int'ls Appln. No. PCT/EP2020/085268 (dated Feb. 8, 2021).
Translation of Int'l Prelim. Exam. Report (Form PCT/IPEA/409) conducted in Int'ls Appln. No. PCT/EP2020/085268 (dated Mar. 23, 2022).
Australia Search Report conducted in counterpart Australia Appln. No. 2020400935 (dated Jan. 19, 2023).

* cited by examiner

METHOD FOR IDENTIFYING THE FILTER INDUCTOR OF A GRID INVERTER

The present disclosure relates to a method for operating an inverter, and to an inverter. To filter the alternating current generated by the switching unit of an inverter, filter coils are installed in the individual phase conductors on the alternating current side. It is advantageous for good control characteristics if the filter coils have a sufficiently linear behavior, which requires relatively expensive filter coils of sufficient size. Filter coils are increasingly being operated in the non-linear inductor range in order to allow for a smaller design, or because the core materials cause a non-linear profile of the inductor. Non-linear characteristics are also used in a targeted manner to better meet different requirements from different operating to domains. If the assumed characteristics or the inductance profile of the coil deviate from the actual profile, this can have a problematic effect on the sine wave shape of the current.

US 2015/0016162 A1 discloses an approach in which, in the control process for a pulse width modulation for a photovoltaic inverter, a value assigned to a filter inductor is determined as a function of a momentary current, and this is taken into account in the control process. The assigned value of the filter inductance in this case is determined from an assignment table or an approximation formula. In both cases, the inductance profile must be known.

Under laboratory conditions, an inductance profile of a filter coil or an inductor can be determined relatively easily with the current state of the art, and stored for a control process. However, the laboratory conditions usually differ from the installation and operating conditions of an inductor. In most cases, the stored inductance profile refers to the average of a random sample of several inductors, and not to the inductor that is actually installed. Once an inductor is installed in a device, it becomes very difficult to determine a useful inductance profile, especially when the device is in operation. To make matters worse, a current flowing through the inductor in the device can contain high frequency distortions.

Hence, in practice, there is often the problem that the stored inductance profile for an inductor or filter coil deviates significantly from the actual inductance profile (that is, the actual profile of the inductance value of the inductor in relation to the current intensity) for the reasons just mentioned. That being said, inductance profiles of inductors are not unitary or constant over time due to aging, changing environmental conditions, and manufacturing tolerances. Especially when inductors are operated in the non-linear range, deviations from the stored inductance profile can reach a problematic level. Finally, the sequence of changes in the current through the inductor which have occurred earlier in its service life can also have an impact on the actual value of the inductance at a specific current. This means that, at a given current value, there can be not only one, but several possible values for the inductance. The reason for this lies in the presence of a hysteresis effect in the magnetization of the core materials of inductors and/or filter inductors.

The present disclosure relates to methods and devices that address these and other problems of the prior art.

In a first aspect, the present disclosure relates to a method for operating an inverter, which has the following steps:
by means of a switching unit of the inverter, applying an AC voltage to a phase line in which a filter inductor is arranged,
determining characteristic values of a coil current and a coil voltage of the filter inductor in the region of a plurality of measuring points, wherein at least two measuring points are together located on at least one flank of a current ripple,
determining, from the characteristic values, a first value of the inductance of the filter inductor for a first value of the coil current,
optionally determining at least one further value of the inductance of the filter inductor for at least one further value of the coil current,
determining at least one inductance profile of the filter inductor with respect to the coil current using the determined first value of the inductance of the filter inductor and, optionally, using the at least one determined further value of the inductance of the filter inductor,
controlling the switching unit of the inverter, by means of a control unit, to generate an alternating current in the phase line, wherein at least one parameter of the control process is continuously adapted to the momentary value of the inductance according to a determined current-dependent inductance profile.

The control process of the inverter thus always has a current inductance profile that corresponds very precisely to the actual inductance profile of the filter inductor, which improves the control quality.

In an advantageous embodiment of the method, determining the first value of the filter inductance can include the following steps:
determining a first slope $m_x$ of a current ripple for the first value of the coil current,
determining a first value $U_x$ of the coil voltage of the first flank slope,
determining the first value $L(I_{L_y})$ of the filter inductor from the first flank slope and the first value of the coil voltage, according to the formula $$L(I_{L_y}) = \frac{U_x}{m_x}.$$

The evaluation of the flank slope of current ripples allows a value of the filter inductance to be determined very precisely at a specific current intensity. The flank slope of the current ripple corresponds to the derivation of the current over time di/dt, such that the value of the filter inductance can be calculated directly using the formula for the inductor $$u_L = L \cdot \frac{di}{dt}$$

and/or $$L = u_L \cdot \frac{dt}{di}.$$

Determining a flank slope usually requires the evaluation of at least two measurement points that are on the same flank of a current ripple. Each flank of a current ripple lies between two switching points of the switching unit, such that the durations of the flanks are known in the control process. This knowledge can be used to ensure that only measured values that lie on a single flank of the same current ripple are used to determine the flank slope. It is also known whether the flank of a current ripple is rising or falling. If the inductance is to be determined with only two measuring points on a flank, one measuring point is provided after a first switching point, and another measuring point is provided before a subsequent switching point. The two measuring points are as far apart as possible.

More than two measuring points are provided on a flank to increase the accuracy or to take into account a curvature of a flank. Optionally, more than two measuring points can also be used to determine the flank slope, and a mean value can be used to calculate the filter inductance. In this case, mean values for the coil current and the coil voltage are formed over a flank of a current ripple, from which the corresponding inductance value for a mean coil current $I_{Ly}$ is determined. As a result, for example, the influence of the curvature of the flanks of the ripple current can be taken into account in a first approximation. In the case of highly non-linear inductors or correspondingly extensive ripple flanks, such as can occur when using H-bridges, for example, the flank slope at the beginning of the flank differs from the flank slope at the end of the flank. An improved control quality can be achieved by using a mean value. If flanks of current ripples occur in the course of the control process, which are too short for a measurement of the flank slope (that is, in which there is only a single measuring point), these flanks are not taken into account in the evaluation.

A characteristic curve and/or an inductance profile of a filter coil can be captured with characteristic values. Characteristic values basically result from the dependence of the coil current and the coil voltage and their rates of change. The slope of a flank of a current ripple can be an example in this context of a characteristic value. Instead of the current, the magnetic flux can also be used to formulate characteristic values. Changes in the characteristics or the inductance profile of a filter coil, which occur as a function of its temperature, the amplitude of the alternating current, the switching frequency, or the switching unit/switching topology used, can also be determined and/or mapped as characteristic values if these dependencies and their temporal relationships are recorded.

In any case, the characteristic values include values from which at least one value of the inductance of a coil can be determined. Several inductance values dependent on a coil current and coil voltage are used to determine at least one inductance profile.

The coil current can advantageously be determined by measuring with a sampling frequency which corresponds to at least double, and preferably to a multiple, of a clock frequency of a pulse width modulation implemented via the switching unit. This "oversampling" allows a very precise evaluation of the profile of the current ripple. The current ripples are caused, for example, by switching operations for pulse width modulation. The method can be carried out with different types of pulse width modulation, for example based on a fixed frequency or a variable frequency.

The flank slope can be determined in an advantageous manner by finding the current difference between at least two sampling steps, and taking into account the sampling frequency. The value for the flank slope can thus be determined in a simple manner to a good approximation as the difference in the measured values from two consecutive current measurements, divided by the length of the measurement interval.

After the determination of the inductance profile, its slope and/or curvature can advantageously be determined.

Advantageously, when a control unit controls the switching unit of the inverter to generate an alternating current in a phase line, at least one parameter of the control process can be continuously adapted to the momentary value of the slope and/or curvature of the inductance profile.

If the inverter has a plurality of phase lines, each with a filter inductor, in a further advantageous embodiment at least one further inductance profile of a further filter inductor in a further phase line can be determined and taken into account in the control process. The method disclosed here can thus be advantageously applied both to single-phase and to multi-phase inverters. The term "a filter inductor" used here is also to be understood in such a way that "a filter inductor" can be formed by a plurality of filter inductors connected to one another. For the sake of simplicity, the total filter inductors of a phase that are effective for the control process are regarded as "a filter inductor."

Advantageously, a method disclosed herein can be carried out before the inverter is first put into operation, and/or at scheduled intervals before a, or before each, startup of the inverter, and/or regularly or constantly during the operation of the inverter. The chosen strategy also depends on the available resources. For example, determining the coil current and coil voltage with a sufficiently high sampling frequency ("oversampling") and determining the values of the filter inductor and optionally adjusting the inductance profile, ties up computing capacity in the control unit. In order to free this capacity, the determination can therefore be carried out, for example, over one (or more) period(s), with the determined inductance profile being optionally stored step by step in a memory. The controller can then subsequently access the stored values without using additional computing capacity. The next determination period can then either be triggered by a specific event (for example, if the control unit detects reduced control quality), or the determination can take place at regular intervals during operation.

In a further aspect, the present disclosure relates to an inverter having a switching unit with which an AC voltage can be applied to at least one phase line, wherein a filter inductor is arranged in the phase line, and wherein the switching unit is controlled by means of a control unit, wherein a coil current of the filter inductor and a coil voltage of the filter inductor can be determined by the control unit, and wherein the control unit is designed to carry out the following steps:

activating the switching unit to apply an AC voltage to a phase line of the inverter,
   determining a first value of the filter inductance for a first value of the coil current,
   optionally determining at least one further value of the filter inductance for a further value of the coil current,
determining an inductance profile of the filter inductor with respect to the coil current, using the determined first value of the filter inductance, and optionally using the at least one determined further value of the filter inductance,
   controlling the switching unit of the inverter to generate an alternating current in the phase line, wherein at least one parameter of the control process is continuously adapted to the momentary coil current according to the determined current-dependent inductance profile.

On the one hand, such an inverter enables improved control performance and, as a result, a more ideal sinusoidal shape of the alternating quantities at the inverter output. On the other hand, cheaper components can be used, which often pose an unmanageable challenge for conventional controllers. In particular, smaller and lighter inductors make it possible to advance miniaturization and cost optimization. However, due to the magnetic saturation that occurs earlier, the smaller and lighter inductors have a non-linear dependence of the inductance on the current, which is taken into account by the solutions according to the invention.

The control unit can advantageously be designed to carry out the inductance profile of the filter inductor before the inverter is first put into operation, and/or at scheduled intervals before a, or before each, startup of the inverter, and/or regularly or constantly during operation of the inverter. This ensures optimal control performance at all times.

In an advantageous embodiment, the inverter can have a plurality of phases, each with a filter inductor, it being possible for an inductance profile to be determined for each filter inductor. This allows the present teachings to be advantageously applied to multi-phase inverters as well.

In the following, the present invention will be described in greater detail with reference to FIGS. 1 to 3, which show exemplary, schematic and non-limiting advantageous embodiments of the invention. In the drawing.

Figure 1:
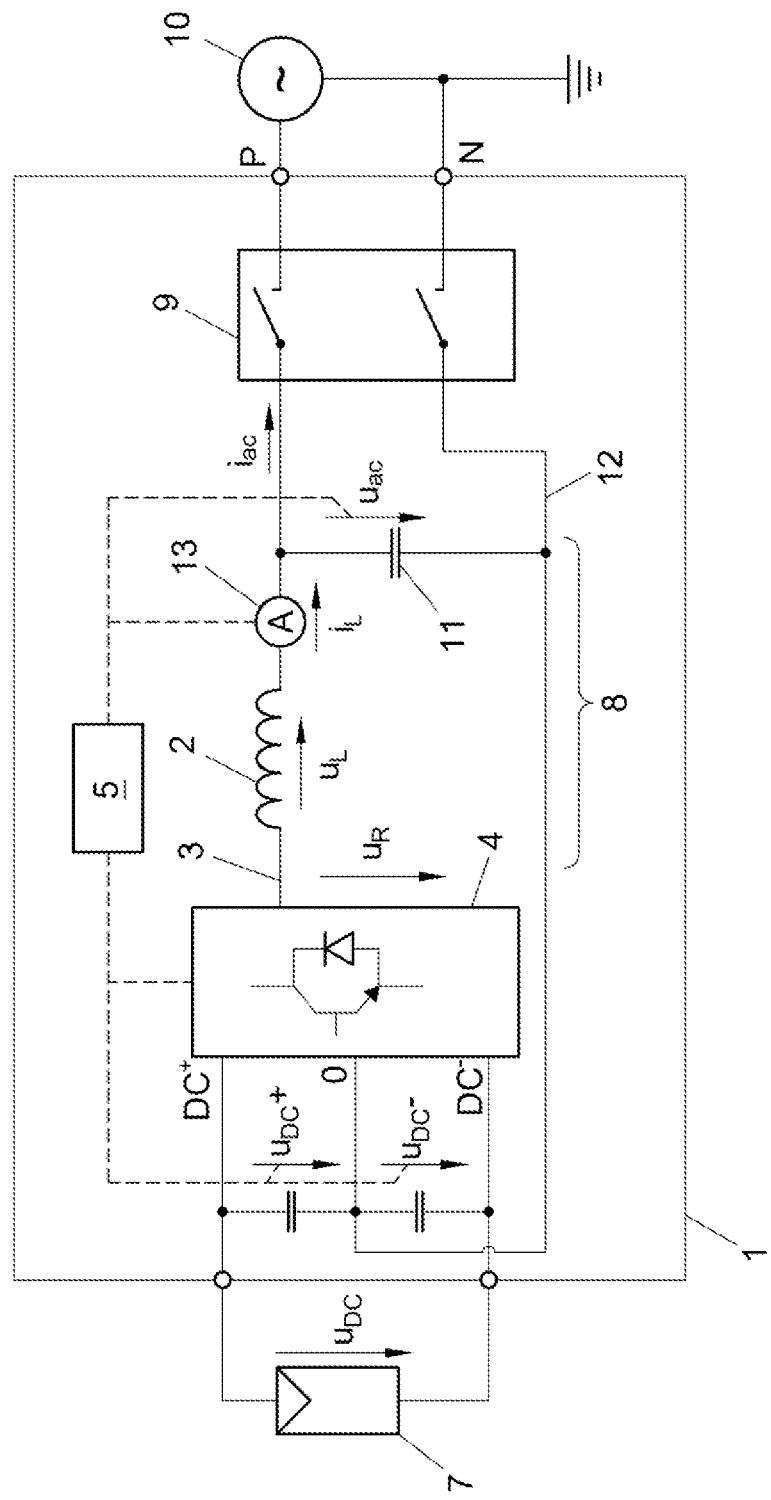
FIG. 1 shows an example of a schematized circuit arrangement of an inverter.

The switching arrangement of an inverter 1 shown in FIG. 1 converts a direct current potential $U_{DC}$ from a direct current source 7 with the aid of a switching unit 4, which is known per se, into a clocked, square-wave alternating current voltage $u_R$, which is applied to a phase line 3. The rectangular AC voltage $u_R$ is then converted by a filter unit 8 into an approximately sinusoidal AC voltage (filter capacitor voltage $u_{ac}$) and/or a correspondingly approximately sinusoidal alternating current $i_{ac}$.

The inverter 1 can be connected to the lines of a power grid 10 via a grid relay 9, the inverter being connected to one phase P and a neutral line N of the power grid 10 in the simplified case shown. The AC voltage $u_{ac}$ feeds a phase current $i_{ac}$ into the power grid 10 when the grid relay 9 is closed.

For the purpose of determining an inductance profile, the inverter is usually connected to the phases of a supply network. However, the inductance profile can also be determined with an inverter without a connection to phases of a supply network, through suitable switching operations and a connection to the neutral line of the supply network, prior to operation with power supply. As part of the manufacture of an inverter, tests are generally carried out on it, during which currents flow that are comparable to the currents that usually occur during operation. In this way, precise induction profiles can be determined by the inverter itself during manufacture without additional expenditure of time and resources. In this way, it can be ensured that an appropriate current is achieved right from the first startup or the first operation with power supply.

The filter unit 8 comprises a filter coil 2 arranged in the phase line 3, and a filter capacitor 11. The first end of the filter coil 2 is connected directly to the switching unit 4, and the phase line 3 leads from the second end of the filter coil 2 to the power grid relay 9. The filter capacitor 11 is arranged in the region between the second end of the filter coil 2 and the power grid relay 9, between the phase line 3 and the neutral line 12.

The switching unit 4 is shown only schematically in FIG. 1; numerous topologies of switching units 4 which can be used to generate the AC voltage are known. The switching unit 4 shown in FIG. 1 corresponds to a three-point circuit, in which the phase line 3 can be supplied by three direct current potentials, a positive direct current potential DC+, a negative direct current potential DC−, and a neutral direct current potential 0, from an intermediate circuit center point which is connected to the neutral line 12. However, the teachings of the present disclosure can also be applied to topologies that have only two DC inputs (for example, DC+ and DC−), or even only one DC input whose potential is not neutral. A topology of the switching unit 4 that can be used for the case shown in FIG. 1 is, for example, the so-called NPC topology, but any other topology can also be used. The adaptation of the circuit to a different topology is one of the capabilities of the average person skilled in the art. The circuit can also have, for example, two or three phase outputs, each with a filter coil, as is known in the art. The topology of the circuit arrangement 4 of the inverter can be selected, for example, from half-bridge, H5, HERIC, REFU, FB-DCBP, FB-ZVR, NPC, Conergy-NPC, and topologies related to these. The topologies denoted in this way are known in the art, and therefore do not need to be explained in more detail here.

The switching unit 4 is connected to a control unit 5 which controls the opening and closing of the semiconductor switches provided in the switching unit 4. A pulse width modulation scheme is usually used in this case. Depending on the control scheme, the control unit 5 has several measured values that are used as input variables for the control. In FIG. 1, the intermediate circuit voltages $u_{dC}^+$ and $u_{dC}^-$ of the positive and negative direct current potentials with respect to the intermediate circuit center point (i.e., the voltages across the intermediate circuit capacitors), the alternating voltage u across the filter capacitor 11, and the coil current through the filter coil 2 are shown schematically as input variables for the control, by dashed lines, by way of example. The measuring devices and circuits required to determine these input variables are known to those skilled in the art, and need not be described in detail here. Depending on the topology, further or other measured values can also be provided as input variables for the control. Optionally, other variables can also be measured if the input variables required for the control can be determined directly or indirectly from them.

In the example shown in FIG. 1, the coil voltage $u_L$ can be determined as a subtraction of the square-wave AC voltage $u_R$ generated by the switching unit 4 and the filter capacitor voltage $u_{ac}$. The square-wave AC voltage $u_R$ can in turn be determined using the given switch position of the switching unit 4 and the values of the intermediate circuit voltages. The coil current $i_L$ can be determined directly, for example, by an ammeter 13 arranged before or after the filter coil 2 in the phase line 3. Optionally, a current measurement can also take place at a different point, for example the phase current $i_{ac}$ and the current across the filter capacitor 11 can be measured, with the coil current $i_L$ resulting from these values. However, the coil current can also be determined indirectly, for example by measuring the magnetic flux of the filter coil. It is essential for the methods disclosed here that there is a possibility of determining the coil current $i_L$ and the coil voltage $u_L$ in some way.

Figure 2:
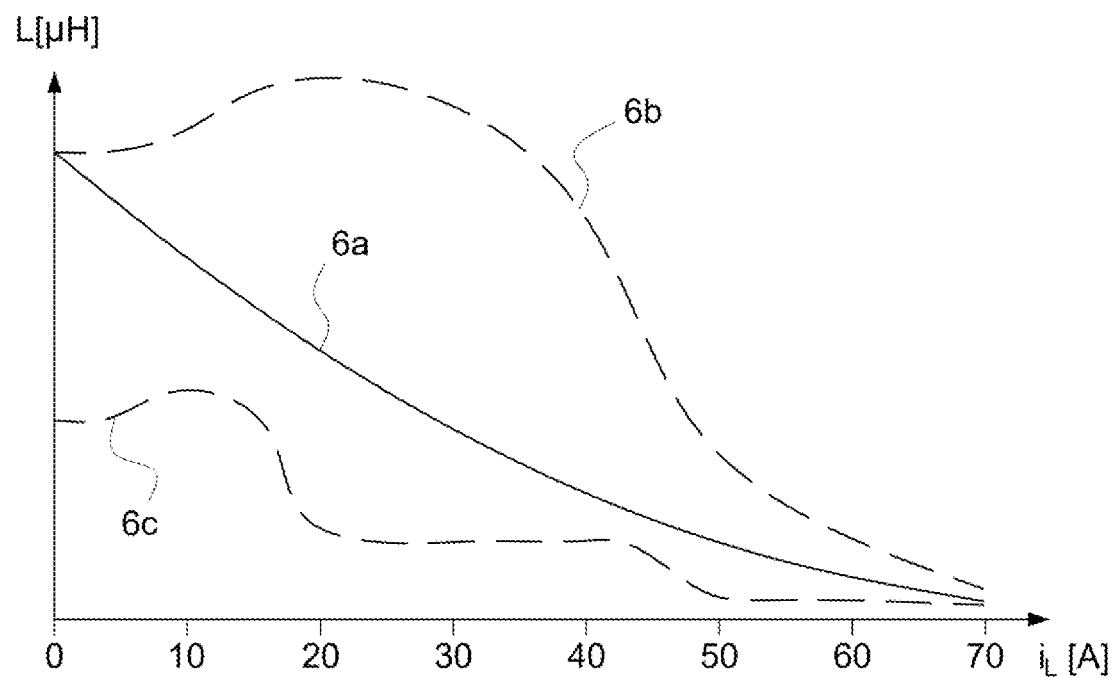
FIG. 2 is a diagrammatic illustration of qualitative inductance profiles.

The filter coil 2 can be operated in current ranges in which there is a non-linear inductance profile, as is shown qualitatively and by way of example using the different profiles of the inductance profile 6a, 6b and 6c in FIG. 2. The inductance L of the filter coil 2 is defined by an inductance profile (6a, 6b, 6c) as a value dependent on the coil current.

The control unit 5 of the inverter also uses the value of the inductance of the filter coil 2 as a parameter. However, if an incorrect value is used, this leads to poor control quality, which can lead to unwanted voltage or current fluctuations. On the one hand, this can undesirably change a reactive power or distort the sinusoidal shape of the current $i_{ac}$; on the other hand, components can be subjected to excessive load, or the inverter can even switch off incorrectly.

In order to be able to use (inexpensive and small) filter coils 2 with a highly pronounced non-linear inductance profile 6, the parameters of the control process dependent on the inductance can be constantly adapted as a function of the current value of the coil current $i_L$. In an inverter according to the invention, the coil current is measured or determined very precisely and with a high sampling rate, such that the control process can be very precisely adapted to the momentary value of the coil current over the entire phase curve. A high control quality can thus be achieved, but only insofar as the inductance profile 6 is correct.

However, the inductance profile 6 of a filter coil 2 can change significantly as a result of environmental influences (for example: temperature, magnetic fields of adjacent coils, or the like) and/or aging. In addition, there are the tolerances and deviations in the inductances of filter coils which result during their manufacture. Accordingly, despite the (supposedly) optimal adaptation of the control process to an only-supposedly correct inductance profile 6, control process errors can nevertheless occur in practice.

Figure 3A:
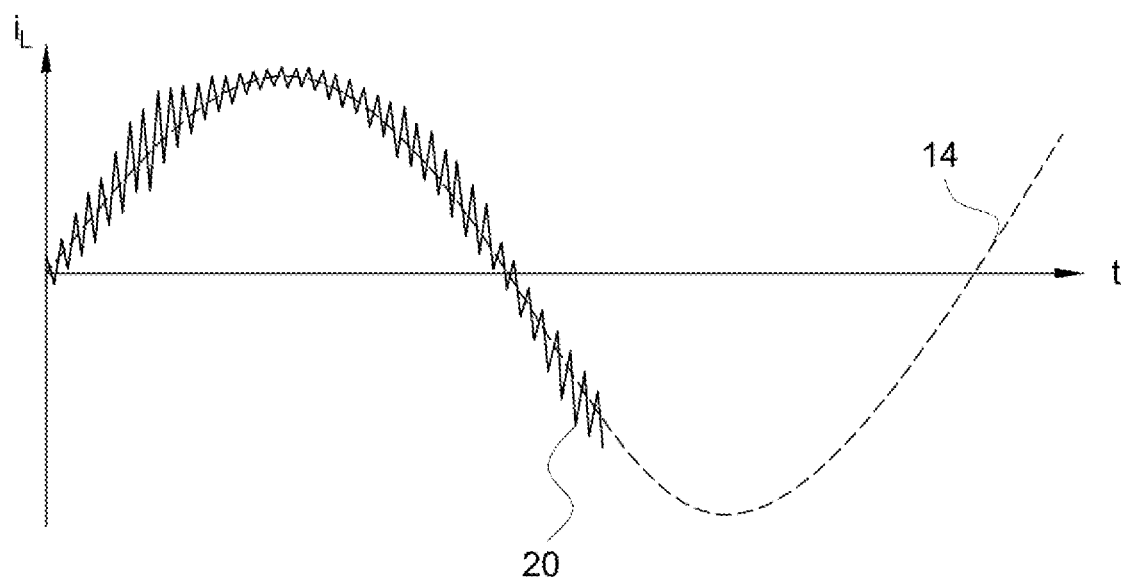
FIG. 3a is a diagrammatic illustration of a current profile.

In FIG. 3a, a profile of a coil current $i_L$ over time t is shown in a diagram. Apart from the current ripples shown in FIG. 3a, there are methods to generate an alternating current in which the current ripples can be many times larger. For example, a method is known from the prior art in which each current ripple has a zero crossing, and an inductance profile of a filter inductor can thereby be determined specifically in the range of the current amplitude of the fundamental wave with one or a few of these large ripples. The current in FIG. 3a essentially follows a sinusoidal curve (the so-called fundamental wave 14 of the current), but has clearly recognizable current ripples, which are shown enlarged in the diagram details shown in FIGS. 3b and 3c. The curves shown in the diagram details in FIGS. 3b and 3c can be located in a different area of the fundamental wave 14—the illustration is chosen arbitrarily and is not to be interpreted as restrictive.

The occurrence of such current ripples is due to technical reasons, and to a certain extent is unavoidable. However, particularly in the region of current amplitudes, current ripples that are too high can cause overcurrents, which can lead to incorrect shutdown (or even damage to components). It is therefore a further object of the invention, with the aid of a precise inductance profile, to know the size of the current ripple before it occurs, and optionally to limit its size by adapting the modulation method or the control process of the switching unit in order to avoid incorrect shutdown. Exact knowledge of the parameters of the filter circuit is essential for the control quality. In the case of non-linear filter coils 2, knowledge of the inductance profile 6 that is as accurate as possible is particularly necessary.

Each current ripple has a rising flank and a falling flank, each flank crossing the fundamental wave 14 of the current.

The coil current $i_L$ is sampled at a high frequency, such that a large number of measurements, for example ten or more measurements, but at least two, are available for each flank of a current ripple. The measurement samples are shown by way of example in FIG. 3b by measurement points 15, 16, 17. It can be seen in FIG. 3b that each flank has a curvature. The curvature of the flank is due to the non-linear behavior of the filter coil 2. It is also possible to take better account of the curvature of a flank by means of three or more measurement points on a flank, because at least two values of the inductance are determined at different points on the curved flank.

Figure 3B:
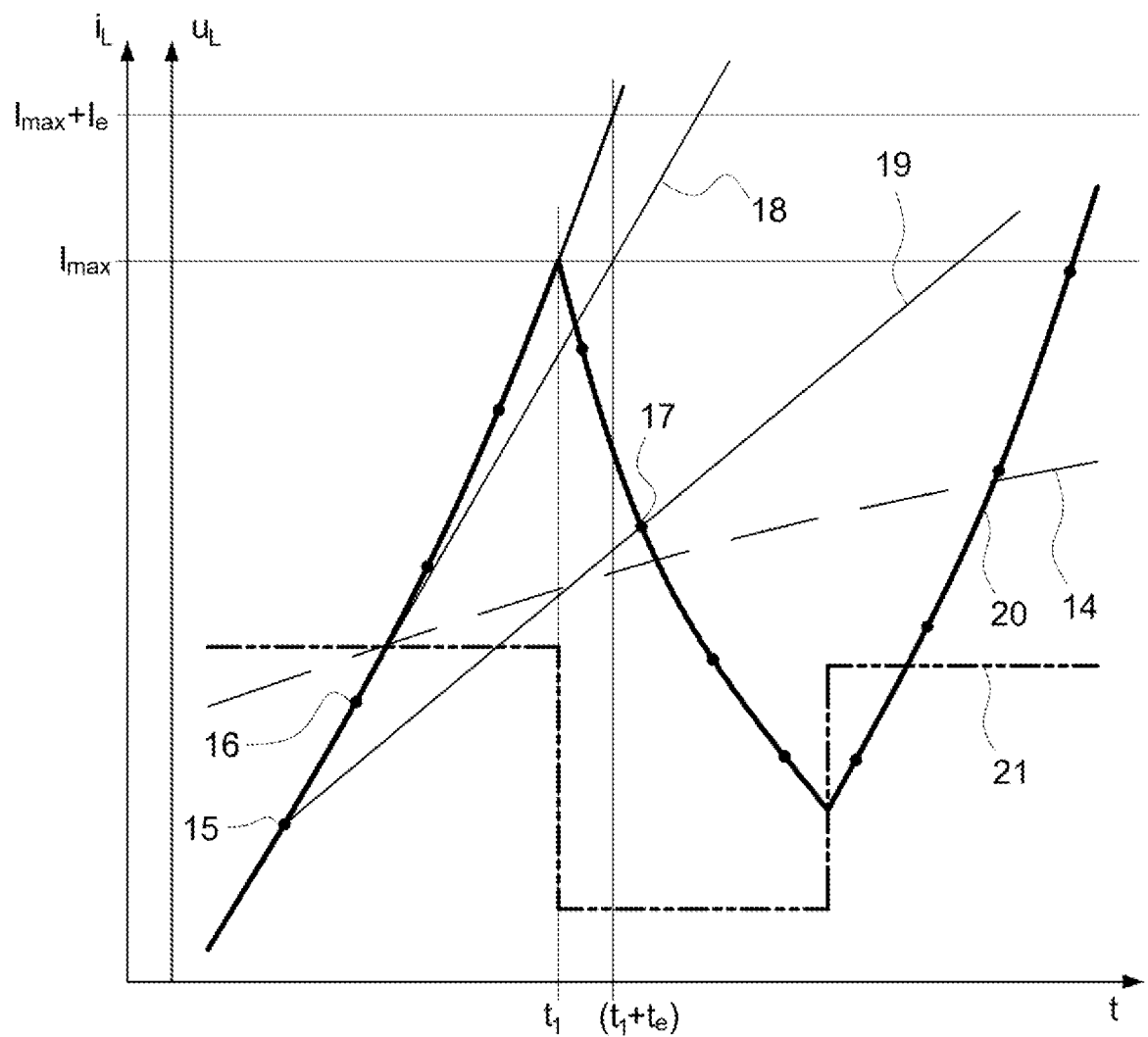
FIG. 3b is a diagrammatic illustration of a current profile, with coil voltage

A flank slope m of the current ripple can be determined between two measurement samples on a flank of a current ripple. A sampling rate that is too low or an unsuitable position or selection of the measuring points for determining inductance values leads to undesirable results, as is illustrated by the straight lines 18 and 19 in FIG. 3b. The straight line 18 is formed by the measurement points 15 and 16 and has a slope $m_x$. Due to the curvature of the flanks of the coil current or ripple current 20, the straight line 18 increasingly deviates from the flank with the measuring points 15 and 16. A control process that should implement the falling flank at time $t_1$ for the coil current $I_{max}$ would hit it only at time $(t_1+t_e)$, using a simple inductance profile, sketched in simplified form, according to the slope m of the straight line 18. At time $(t_1+t_e)$, the coil current would already be $I_{max}+I_e$, since the coil current would have increased further by $I_e$ due to the start being delayed by $t_e$. Even larger deviations would result if two measuring points which do not lie on a flank, for example the measuring points 15 and 17 shown in FIG. 3b, are used when determining the slope m. The straight line 19 through the measuring points 15 and 17 illustrates that $I_{max}$ would be expected to be reached by a control at a much later point in time, and would therefore be exceeded even more clearly than in the example using the straight line 18. In this case, the control would probably no longer be possible. In order to avoid faulty shutdowns and to improve the control quality, the relationship of the measuring points to the given flank, and in particular an existing curvature, are taken into account for the determination of an inductance profile according to the invention.

Figure 3C:
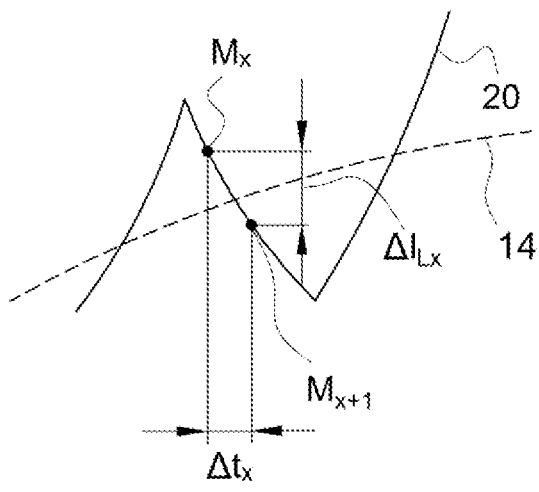
FIG. 3c is a diagrammatic illustration of a current profile, with two measuring points.

In a diagram detail from FIG. 3a, two measurement points on a flank of a current ripple are shown in FIG. 3c by way of example. In this case, the flank slope $m_x$ is determined, for example, between the two measurement points $M_x$ and $M_{x+1}$. Each measurement point $M_x$ comprises a current value $I_{Lx}$ at time $t_x$ (x=1, 2, . . . , n). The flank slope $m_x$ is found from the current difference $\Delta I_{Lx}$ divided by the period between the two measurement samples $\Delta t_x$, where $\Delta I_{Lx}=(I_{L(x+1)}-I_{Lx})$ and $\Delta t_x=(t_{x+1}-t_x)$.

Furthermore, a value $U_x$ of the coil voltage $u_L$ is determined for each or multiple measuring points. As shown in FIG. 3b, the coil voltage $u_L$ shown as a dash-dot-dot line 21 can be assumed to be constant over the duration of a flank, for the sake of simplification.

A value of the inductance $L(I_{Ly})$ which is dependent on a coil current $I_{Ly}$ can be calculated using the flank slope $m_x$ and the coil voltage $U_x$, according to the formula $$L(I_{Ly}) = \frac{U_x}{m_x}.$$

The inductance value determined in this way forms a pair of values for an inductance profile with a coil current $I_{Ly}$.

The coil current $I_{Ly}$ can correspond, for example, to $I_{Ly}=I_{Lx}$, to a mean value $I_{Ly}=(I_{L(x+1)}+I_{Lx})/2$, or to a value determined from more than two current values $I_{Lx}$. The latter makes particular sense when a slope is determined from more than two current values. In addition, a pair of values for an inductance profile can be supplemented with further characteristic values, such as a temperature, a current amplitude, the sign of the slope $m_x$. On the basis of these, a classification into different inductance profiles can take place. These further characteristic values can either already be included in the measuring points, or are only determined in relation to a pair of values.

The flank slope $m_x$ and the coil voltage $U_x$ can be determined using the procedure described above for a plurality of different values $I_{Lx}$ of the coil current $I_L$. The values determined are able to substantially cover the entire profile of the coil current $i_L$ that forms the fundamental wave 14 of the current. A value $L(I_{Ly})$ for the inductance of the filter coil 2 can thus be determined for a sufficient number of values of the coil current $i_L$, such that the entire profile of the at least one inductance profile 6 over the relevant current range can be determined with sufficient accuracy. This can be done, for example, using a suitable regression method, for example a linear regression. In practical tests, an adaptation to a 2nd degree polynomial function has proven to be a sufficiently good approximation for some filter coils 2; however, depending on the application, polynomial functions of a higher degree, or also of the 1st degree (that is, a representation using a straight line) can be used if this is advantageous. With the adaptation and/or regression, the inductance profile 6 can be represented as a simple formula which represents the inductance of the filter coil 2 as a function of the coil current.

For example, an inductance profile can be represented as a polynomial $$L(I) = \sum_{i=0}^{n} a_i \cdot I^i$$

where n>0, wherein the coefficients $a_i$ are determined by regression analysis.

Figure 4:
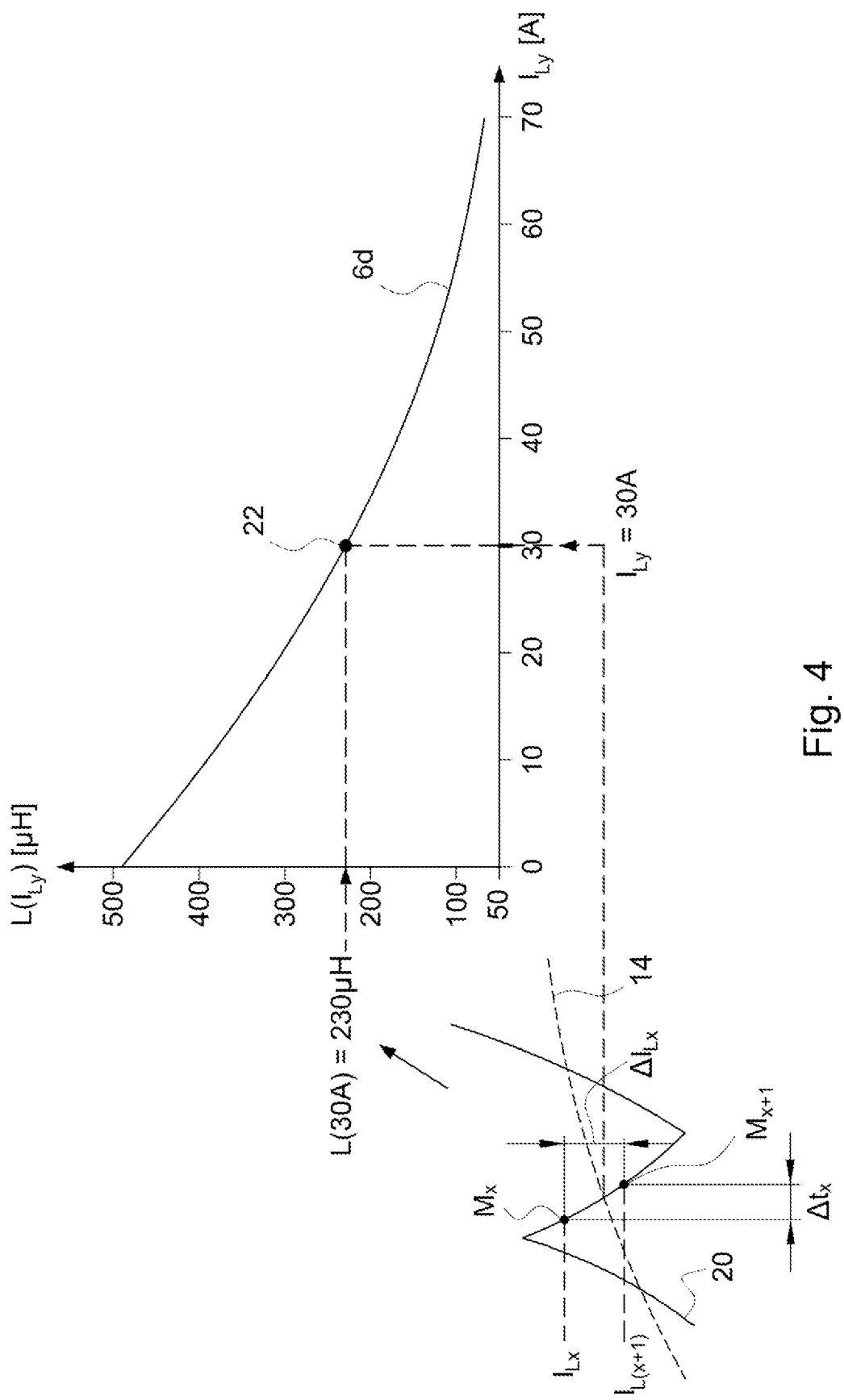
FIG. 4 is a diagrammatic illustration of the adjustment of an inductance profile.

If the qualitative profile of the inductance profile 6 is known (or is assumed to be known), the inductance profile 6 can optionally be determined using a single determination of an inductance at a specific coil current. In FIG. 2, the lines 6a, 6b, and 6c show possible qualitative profiles of an inductance profile of a coil, the position of which can be quantitatively adjusted with a determined inductance value for a specific coil current. FIG. 4 shows this using an inductance profile 6d, the position of which is quantitatively adapted from the position of 6a in FIG. 2 by means of a value for the inductance ($L(I_{Ly})$=230 pH) which was previously determined for a current ($I_{Ly}$=30 A). The position of the inductance profile 6d is determined using the pair of values 22 for $I_{Ly}$ and $L(I_{Ly})$. In this way, in FIG. 4, a control unit can subsequently determine a value of the inductance for any current $I_{Ly}$. In the example in FIG. 4, a current value was defined between $I_x$ and $I_{x+1}$, and assumed to be 30 A. In the case shown, this corresponds approximately to the current value of the fundamental wave 14 during the measurement. As previously mentioned, $I_{Ly}$ could also be defined as $I_{Ly}=I_{Lx}$, or in any other meaningful way.

Usually, however, a sufficient number of measurements is available to carry out a more precise adaptation on the basis of a number of determined inductances at different coil currents.

The slope and curvature of the inductance profile 6 can subsequently be determined for an inductance profile 6 that has already been determined. If the inductance profile 6 is in the form of a polynomial, for example, this can be done in a particularly simple manner by means of the first and second derivation of the current.

With the help of the inductance profile 6, a control parameter can be continuously adapted to the momentary coil current. For example, a proportional controller with a variable amplification factor $K_p(L(I))$ can be defined. The value of the amplification factor $K_p$ is constantly adapted to the momentary value of the current, such that the most suitable inductance value is always used over the entire (sinusoidal) current curve. As a result, the dynamic behavior of the controller is independent of the current amplitude of the momentary alternating current.

In an expanded embodiment, a control parameter can be continuously adapted to the momentary coil current using the slope of the inductance profile 6, in order to be able to better estimate the expected change in the coil current.

In an expanded embodiment for work areas in which the inductance profiles are very particularly non-linear, a parameter of the control can also be continuously adapted to the momentary coil current using the curvature of the inductance profile 6, in order to be able to estimate the expected change in the coil current even better.

The above method for determining the inductance profile 6 can be carried out, for example, before the inverter 1 is put into operation for the first time. This can be sufficient for filter coils 2 whose inductance profile is subject to only very slight changes over the period of its use. Optionally, the method can also be carried out at scheduled intervals according to any scheme, before a, or before each, startup of the inverter 1. The scheme can be linked to conditions, for example. For example, the determination can always be carried out before startup if the lower or upper limits of a parameter range that is characteristic of the control quality were exceeded during the last operation. Optionally, the determination of the inductance profile 6 can also be carried out regularly, irregularly or constantly during the operation of the inverter 1. This is possible without any problems, since the determination of the inductance profile 6 can be carried out without any problems during the actual operation of the inverter 1. For example, the control unit 5 can randomly check the agreement of a value of the inductance determined via a measurement with a value determined using the inductance profile 6. If the deviation is too large, the inductance profile 6 can be determined and updated during operation, or scheduled before the next startup.

LIST OF REFERENCE SIGNS inverter 1
filter coil 2
phase line 3
switching unit 4
control unit 5
inductance profile 6
direct current source 7
filter unit 8
grid relay 9
power grids 10
filter capacitor 11
ammeter 13
fundamental wave 14
measuring points 15, 16, 17
straight lines 18, 19 coil current $i_L$ 20
coil voltage $u_L$ 21
pair of values 22
coil current $i_L$
phase current $i_{ac}$
coil voltage
square-wave alternating current voltage $u_R$
filter capacitor voltage $u_{ac}$
square-wave alternating current voltage $u_R$
flank slope m
inductance L

The invention claimed is:

1. A method for operating an inverter, the method comprising:
via a switching unit of the inverter, applying an AC voltage to a phase line in which a filter inductor is arranged,
determining characteristic values of a coil current ($i_L$) and a coil voltage ($u_L$) of the filter inductor in the region of a plurality of measurement points, wherein at least two measurement points are together located on at least one flank of a current ripple,
determining, from the characteristic values, a first value of the inductance ($L(I_{Ly})$) of the filter inductor for a first value of the coil current ($I_{Ly}$),
wherein the method further comprises:
determining at least one further value of the inductance of the filter inductor for at least one further value of the coil current,
determining at least one inductance profile of the filter inductor with respect to the coil current, using the determined first value of the inductance ($L(I_{Ly})$) of the filter inductor, and using the at least one further determined value of the inductance of the filter inductor, wherein the inductance profile describes a dependency of the values of the inductance ($L(I_{Ly})$) of the filter inductor on the coil current,
controlling the switching unit of the inverter, via a control unit, to generate an alternating current in the phase line, wherein at least one parameter of the control is continuously adapted to the momentary value of the inductance according to a determined current-dependent inductance profile,
wherein the inductance profile is determined before the inverter is first put into operation, and/or at scheduled intervals before a, or before each, startup of the inverter.

2. The method according to claim 1, wherein the determination of the first value of the filter inductance comprises:
determining a first flank slope ($m_x$) of a current ripple for the first value of the coil current ($I_{Ly}$),
determining a first value ($U_x$) of the coil voltage at the first flank slope, determining the first value ($L(I_{Ly})$) of the inductance of the filter inductor from the first flank slope ($m_x$) and the first value of the coil voltage ($U_x$), according to the formula $$L(I_{Ly}) = \frac{U_x}{m_x}.$$

3. The method according to claim 1, wherein the coil current is determined by measuring with a sampling frequency which corresponds to at least double, and preferably a multiple, of a clock frequency of a pulse width modulation implemented via the switching unit.

4. The method according to claim 3, wherein the flank slope is determined by finding the current difference between at least two sampling steps, and taking into account the sampling frequency.

5. The method according to claim 1, wherein, after the inductance profile has been determined, its slope and/or curvature is determined.

6. The method according to claim 5, wherein, when the switching unit of the inverter is controlled by a control unit to generate an alternating current in a phase line, at least one parameter of the control is continuously adapted to the momentary value of the slope and/or the curvature of the inductance profile.

7. The method according to claim 1, wherein at least one further inductance profile of a further filter inductor in a further phase line is determined and taken into account in the control process.

8. The method according to claim 1, wherein the determination of the inductance profile is carried out regularly, irregularly, or constantly during operation of the inverter.

9. The method according to claim 1, wherein a plurality of values of the filter inductance is determined in a current ripple, and a mean value is formed therefrom, the inductance profile of the filter inductor being determined using the mean value.

10. The method according to claim 1, wherein a first inductance profile is determined from flanks with a positive slope, and a second inductance profile is determined from flanks with a negative slope.

11. The method according to claim 1, wherein at least one inductance profile is determined for each of a plurality of current amplitudes of an alternating current.

12. An inverter having a switching unit with which an AC voltage can be applied to at least one phase line, wherein a filter inductor is arranged in the phase line, and wherein the switching unit is controlled by a control unit, wherein a coil current ($i_L$) of the filter inductor and a coil voltage ($u_L$) of the filter inductor can be determined by the control unit, wherein the control unit or a further computing unit of the inverter is designed to carry out:
activating the switching unit to apply an AC voltage to a phase line of the inverter,
determining a first value ($L(I_{Ly})$) of the filter inductor for a first value of the coil current ($I_y$),
determining at least one further value of the filter inductance for a further value of the coil current,
determining an inductance profile of the filter inductor with respect to the coil current, using the determined first value of the filter inductance and using the at least one determined further value of the filter inductance, wherein the inductance profile describes a dependency of the values of the inductance ($L(I_{Ly})$) of the filter inductor on the coil current,
controlling the switching unit of the inverter to generate an alternating current in the phase line, wherein at least one parameter of the control is continuously adapted to the momentary coil current according to the determined current-dependent inductance profile,
wherein the control unit or another computing unit of the inverter is designed to determine the inductance profile of the filter inductor before the inverter is first put into operation, and/or at scheduled intervals before a, or before each, start-up of the inverter.

13. The inverter according to claim 12, wherein the control unit or another computing unit of the inverter is designed to determine the inductance profile of the filter inductor regularly, irregularly, or constantly during the operation of the inverter.

14. The inverter according to claim 12, wherein the inverter has a plurality of phases, each with a filter inductor, and an inductance profile can be determined for each filter inductor.

15. The inverter according to claim 12, wherein the determination of the induction profile is carried out outside the control unit by a dedicated microcontroller, a controller, or another computing unit.

* * * * *